US006263937B1

(12) United States Patent
Barnes

(10) Patent No.: US 6,263,937 B1
(45) Date of Patent: Jul. 24, 2001

(54) APPARATUS FOR MAKING RESIN-IMPREGNATED FIBER SUBSTRATES

(75) Inventor: Richard D. Barnes, Stokesdale, NC (US)

(73) Assignee: ARE Industries, Inc., Stokesdale, NC (US)

( * ) Notice: Subject to any disclaimer, the term of this patent is extended or adjusted under 35 U.S.C. 154(b) by 0 days.

(21) Appl. No.: 09/321,049

(22) Filed: May 27, 1999

(51) Int. Cl.⁷ .................................................. B65H 81/00
(52) U.S. Cl. ........................ 156/426; 156/174; 156/181; 156/428; 156/431
(58) Field of Search ..................................... 156/169, 173, 156/174, 175, 177, 178, 189, 425, 426, 429, 427, 431

(56) References Cited

U.S. PATENT DOCUMENTS

| | | |
|---|---|---|
| 2,725,090 | 11/1955 | Runton et al. . |
| 2,797,728 | 7/1957 | Slayter et al. . |
| 3,029,179 | 4/1962 | Wilson et al. . |
| 3,068,133 | 12/1962 | Cilker et al. . |
| 3,200,022 | 8/1965 | Matton . |
| 3,250,602 | 5/1966 | Stalego . |
| 3,250,654 | 5/1966 | Rubenstsein . |
| 3,874,970 | 4/1975 | Dunn . |
| 4,028,164 | 6/1977 | Montagut . |
| 4,172,748 | 10/1979 | Petzetakis . |
| 4,265,691 | 5/1981 | Usui . |
| 4,326,905 | 4/1982 | Tanaka . |
| 4,371,415 | 2/1983 | Tanaka . |
| 4,411,722 | 10/1983 | Yakazawa et al. . |
| 4,420,359 | 12/1983 | Goldsworthy . |
| 4,758,397 | 7/1988 | Schreiner et al. . |
| 4,943,334 | 7/1990 | Medney et al. . |
| 5,266,139 | 11/1993 | Yokota et al. . |
| 5,376,326 | 12/1994 | Medney et al. . |
| 5,478,421 | 12/1995 | Medney et al. . |
| 5,804,008 | * 9/1998 | Kennard et al. ........................ 156/72 |

* cited by examiner

Primary Examiner—Sam Chuan Yao
(74) Attorney, Agent, or Firm—Summa and Allan, P.A.

(57) ABSTRACT

A method and apparatus are disclosed for forming a resin-impregnated fiber web that is particularly suitable for use in reinforced plastic composites and printed circuit board applications. The method includes the steps of drawing machine direction yarns from multiple spools contained in creels arranged around a hollow cylinder; passing machine direction yarns from the creels through a circular reed; pulling machine direction yarns the length of the hollow cylinder's outer surface in a longitudinal direction; controlling the application of an uncured or partially cured thermoset or thermoplastic resin to the yarns as they travel the length of the hollow cylinder; winding cross-direction yarns around the periphery of the hollow cylinder (i.e., on top of the machine direction yarns) thereby forming a web; heating and cooling the resulting web; and finally collecting the web on a roll. In its apparatus aspects, the invention includes a hollow cylinder, a creel surrounding the hollow cylinder for supporting machine direction yam, a resin heater and pump for heating and pumping the resin to a resin manifold for applying resin to the yarns, a controller for controlling the speed of the machine direction yarns and the amount of resin applied to the yarns, a rotating disk supported by a support ring and powered by electromagnetic actuators, a yarn supply containing cross-direction yarns supported by the rotating disk, circular heaters for partially curing the resin saturated yarns located around the periphery of the cylinder, and a slitter for cutting the resin-impregnated fiber web into separate sections.

35 Claims, 3 Drawing Sheets

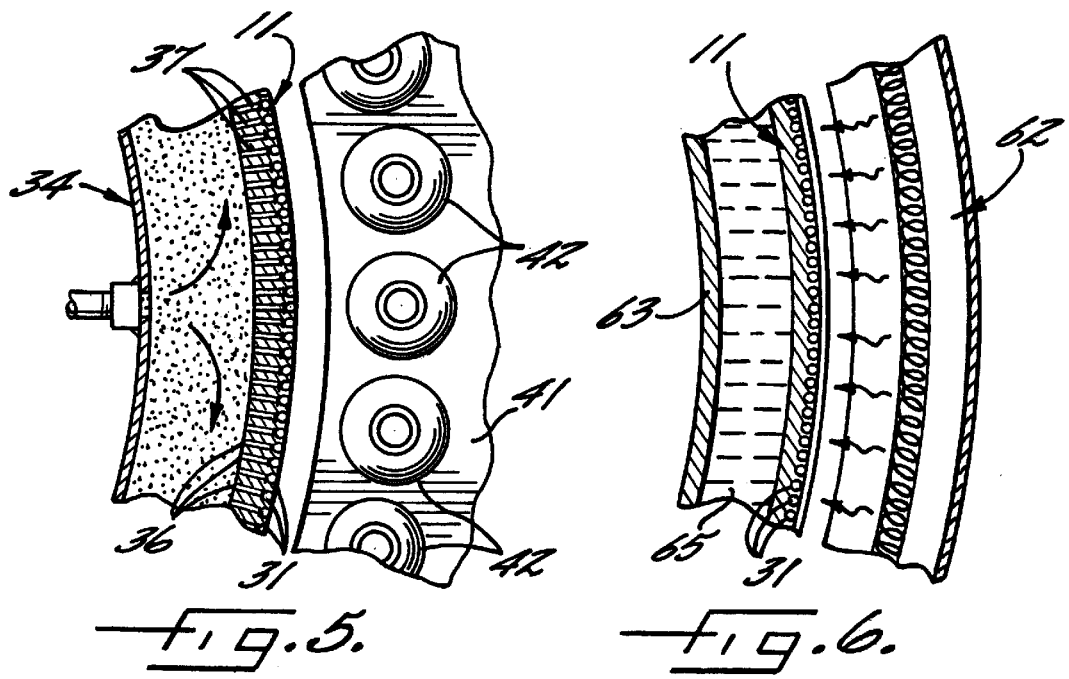
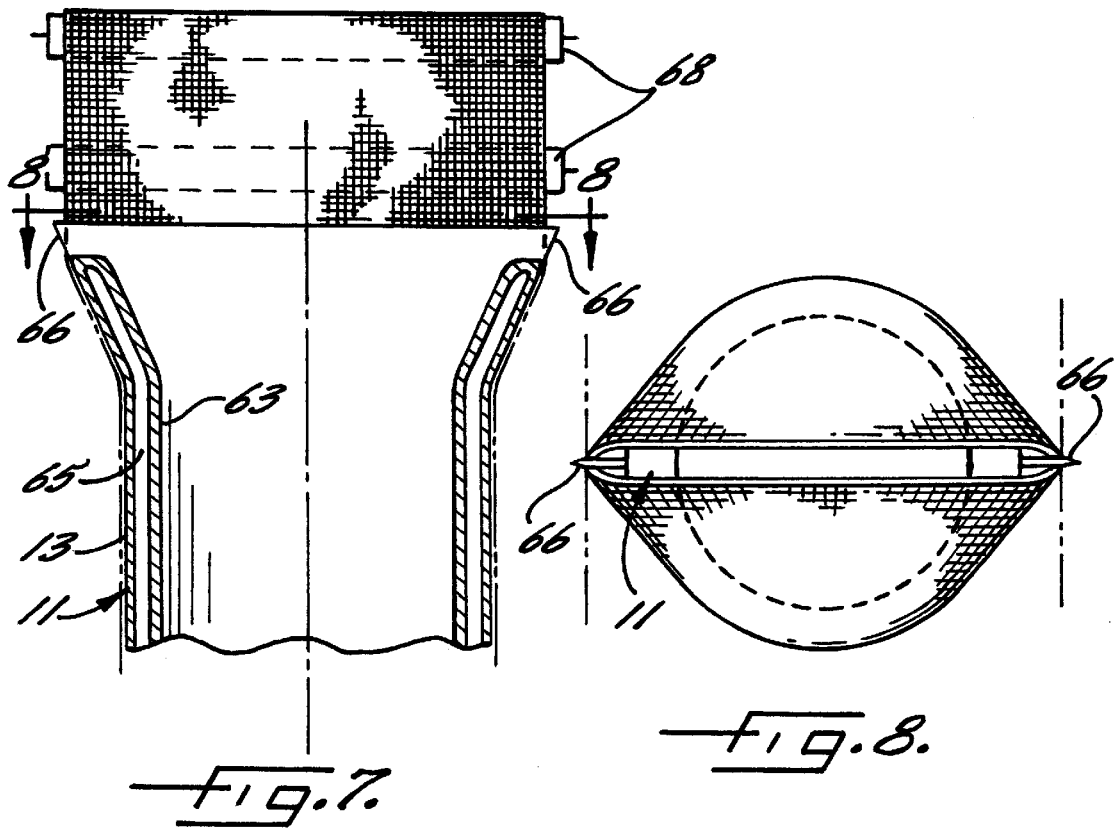

APPARATUS FOR MAKING RESIN-IMPREGNATED FIBER SUBSTRATES

FIELD OF THE INVENTION

The invention relates to a method and apparatus for making a resin-impregnated fiber substrate suitable for use in a variety of fabrication processes and particularly suitable for use in reinforced plastic composites and printed circuit board applications. More particularly, the invention pertains to a method and an apparatus for forming a resin-impregnated web that minimizes surface imperfections and maintains a structurally favorable perpendicular arrangement of the yarns in the composite substrate.

BACKGROUND OF THE INVENTION

The current world market for resin-impregnated fiber substrates exceeds approximately 800 million yards per year. Resin-impregnated fiber substrates for composite structural applications account for 100 plus million yards (e.g., woven fiberglass, woven aramid sold under the trademark KEVLAR™, carbon, and other fabrics) while basic composites and electronic circuit boards account for 700 plus million yards (e.g., woven fiberglass fabrics).

A variety of conventional methods are commonly used to produce flat, bi-directional fiber substrates for use in other fabrication processes and structures such as reinforced plastic composites. In these conventional methods, a first set of yarns is positioned perpendicular to a second set of yarns after which the yarns are fixed in a resin to produce a substrate. The substrates are produced in the form of moldable resin-impregnated products. The moldable products can be cut into workpieces and used in the production of composite structures for the aerospace, automobile, and electronics industries. As referenced above, a common application is the use of the composite structures in the production of printed circuit boards typically used in the computer industry.

Conventional production methods for manufacturing resin-impregnated substrates often result in products that are less than suitable for particular applications. For example, advances in integrated circuit (IC) technology require a large number of integrated circuits to be placed on an individual printed circuit board. These integrated circuits have to be interconnected on the printed circuit board comprised of multiple layers (e.g., substrates with conductor traces such as copper). The surfaces of resin-impregnated substrates used in printed circuit boards often contain surface imperfections that adversely affect the conductivity of the circuit board. Minor flaws or "pimples" on the surface of the substrate are transferred to the conductive layer or layers (e.g., copper) subsequently applied to the base substrate during molding of the circuit board. Stated differently, the surface imperfections on the underlying substrate are transferred to the layers applied thereon, thus resulting in non-uniform conductive layers. Accordingly, conductive layers riddled with the surface imperfections exhibit reduced conductivity in the resulting circuits and hence degrades the overall performance of the printed circuit boards.

In order to compensate for the variations in the conductivity of the individual metal layers created by the imperfections, individual circuits having an increased cross-section are used on the printed circuit board. The increased size of the circuits limits the total number circuits that can be placed on the circuit board. Thus, the imperfections on the surface of the substrates forming the circuit board become a limiting factor in the production and performance of the printed circuit boards.

Substrates that are produced by weaving techniques further degrade the conductivity and hence limit the number of circuits on the circuit board. The weaving technique results in a weave pattern on the surface of the substrate. As conductive layers are molded on the underlying substrate, the weave pattern is transferred to the conductive layer, thus, further affecting the performance of the circuit board and further limiting the number of circuits that can be placed on the board.

One conventional method of producing resin-impregnated substrates includes the steps of weaving a fabric, applying a finish to the fabric, and then impregnating the finished fabric with a thermosetting or thermoplastic resin. The step of weaving a fabric to be impregnated includes beaming or warping yarns (i.e., winding warp yarns onto a beam in preparation for weaving or warp knitting) for the machine direction (i.e., direction in which the fabric is being produced in the machine) onto section beams, warp sizing the yarns while transferring the warp yarns from a section beam to a loom beam, placing the loom beam onto a loom, and finally applying the cross-direction (i.e., direction perpendicular to the direction in which the fabric is being produced by the machine) yarns to the machine direction yarns by either weaving the cross-direction yarns into the machine direction yarns or by warp-knitting. The terms "warp knitting" and "weft knitting" are used according to common industry standards wherein warp knitting denotes a type of knitting in which yarns generally run lengthwise in the fabric. Weft knitting is understood to describe a type of knitting whereby one continuous thread runs crosswise in the fabric.

The step of applying a finish to the fabric to be impregnated includes the preliminary step of cleaning the fabric to remove any chemicals previously applied to the yarns during the weaving or warp-knitting process. Next, the fabric is treated with additional chemicals to ensure compatibility between the woven yarns and the resin to be applied.

The impregnating step involves saturating the finished fabric with resin. The amount of resin applied to the fabric is controlled or metered to obtain the desired weight of the fabric. Conventional methods for metering the amount of resin applied includes scrapers as disclosed in U.S. Pat. No. 3,068,133 to W. H. Cilker et al.

In addition, the impregnating step requires the fabric to be heat treated to remove any residual solvents from the fabric remaining from the previous chemical treatment. The heat treatment is also necessary to partially cure the resin coating the fabric. This first conventional method of producing a resin-impregnated fiber substrate requires a variety of preliminary and subsequent processing steps other than the basic steps of weaving, applying a finish, and impregnating. Thus, the first conventional method is logistically inefficient and time consuming.

A second conventional method for producing a flat, bi-directional substrate involves a process commonly referred to as "filament winding" whereby a first set of yarns is saturated with resin and then wound at a desired angle around a flat rotating mold or mandrel to form a first set of yarns. Next, the flat mold is rotated ninety degrees from its original position and then a second set of yarns is wound around the first set of yarns, thereby forming a web of a predetermined thickness and desired pattern (e.g., checker board). Nevertheless, this process requires the manufacturer to produce multiple batches of resin for each individual substrate section. Accordingly, the second conventional method is time-consuming considering the multiple steps required to produce a single substrate section (e.g., the steps of saturating, winding, and rotating). Furthermore, the substrate is limited to the size of rotating mold.

Specifically, during the first conventional method, bobbin yarns for the warp are wound onto section beams. While the yarns on the section beams are combined to make a loom beam, warp sizes are applied to the yarns for weaving. On the loom, the sized warp yarns from the loom beam are interlaced (i.e., woven) with the weft yarns at a maximum rate of 0.42 yards per minute for a weft yarn count of forty (40) yarns per inch. The woven greige (i.e., unfinished) fabric is then heat cleaned and a finish is applied to the heat cleaned fabric which is then dried. Next, the finished fabric is shipped to a prepregger where the fabric is subsequently impregnated with resin. Prior to and following each manufacturing step referenced above, the fabric is either stored in inventory or staged on the floor, thereby creating periods of work stoppage (i.e., down-time) and increasing the amount of floor space required to produce a woven resin-impregnated substrate.

The various conventional techniques for applying resins to yarns that are incorporated into the substrate include moving yarns through resin-filled vessels or basins. This technique is commonly referred to as a "resin bath". Yet, another technique for applying resin includes the use of spray devices to deliver liquid resin to either the interior or exterior of the warp yarns. Nevertheless, it is difficult to control the amount of resin delivered to the yarns forming a part of the substrate. The amount of resin delivered to the yarns is critical to the formation of the substrate because the amount of resin on each yarn determines the volume fraction (i.e., weight) of resin applied to the yarns. Furthermore, the amount of resin is also critical to the uniformity and consistency of the substrate.

As referenced above, conventional techniques for metering resin include the use of scrapers or adjustable spray nozzles. Unfortunately, the resin tends to clog the openings in the spray nozzles and create a build-up on the scrapers, thus requiring downtime for maintenance and cleaning. Furthermore, the clogged spray nozzles and the buildup of resin on crude scraping devices adversely affects the ability of the operator to accurately control the amount of resin applied or removed from the resin-coated substrate. Therefore, a need exists for an apparatus that accurately measures and controls the amount of resin applied to yarns during the production of resin-impregnated substrates.

After resin is applied t o the warp or cross-direction yarns of non-woven fabrics in conventional methods (e.g., resin bath), the warp yarns are weighted with resin and, as a result, the uniform spacing provided by the combination of dual annular rings and comb devices is forfeited due to the effects of surface tension. The surface results in the bunching of the weft and/or machine direction yarns that are suspended or supported by the dual ring device.

For example, U.S. Pat. No. 2,797,728 to G. Slayter et el. discloses a method and apparatus for producing a reticulated fibrous product. Slayter utilizes a series of vertically arranged, co-axial annular rings for supporting machine direction yarns as they advance in an upward direction. Slayter includes a resin bath for applying resin to the machine direction yarns at a midway point between the annular rings. Nevertheless, the resin-coated, longitudinal yarns tend to bunch together at a midway point between the resin bath and the upper ring due to the distances separating the resin bath and upper ring. The surface tension effect or bunching occurs because the cohesive forces of the liquid resin coating the yarns overcomes the tensile stress applied to the yarns as the yarns are stretched between the annular rings and contact surfaces in the resin bath.

The bunching together of the yarns results in non-uniform spacing of the yarns in the resulting product (i.e., substrate). As described above, the spacing discrepancies translate into surface imperfections that adversely affect the conductive layers molded to the substrate forming the printed circuit board. In short, the reduced performance (i.e., reduced conductivity and increased resistivity) of the multi-layered printed circuit board degrades the overall performance of the system incorporating conventionally manufactured resin-impregnated fiber substrates forming a part of the board.

Further, yarns having, less than six hundred-fifty denier are easily damaged due to abrasion when drawn over stationary surfaces. For example, conventional methods for producing substrates typically require at least two contact surfaces over which yarns are pulled during the manufacturing process. These surfaces include combs for separating yarns, curvatures for directing yarns through resin baths, and rods for directing the yarns in a different direction. The damaged yarns degrade the quality of the web and result in substrates that are not suitable for use in certain applications such as printed circuit boards.

The methods described above are time-consuming and costly when considering the number of steps required to produce the substrate and the amount of chemicals necessary to properly treat the fabric. The first method described above requires multiple steps to include beaming whereby yarns are drawn from individual packages of yarns in creels by a draw roll and then wound around a beam. The beaming operation is a preliminary step to the actual impregnating step. The intermediate steps between the beaming and impregnating steps include the steps of warp sizing the yarns and thereafter transferring the warp yarns to a loom beam. During the step of warp sizing, compounds are applied to the warp yarn to bind the fibers and stiffen the yarn in preparation for weaving. Further, the step of transferring includes moving the warp yarns from a flanged roll (i.e., section or beam) to a loom beam for the weaving or warp-knitting step. The number of mechanically diverse steps in the first conventional method increases the likelihood that the mechanical parts will either breakdown or render the manufacturing process inoperable due to mechanical fatigue.

The second conventional method described above requires a certain amount of down-time while the flat mold containing the first set of yarns is rotated ninety degrees to allow a second set of yarns to be wound about the first set of yarns. As described above, the known methods fail to provide a continuous high-speed process for continuously forming a resin-impregnated substrate whereby yarns are drawn from creels, separated and maintained at a spaced apart relationship, coated with a controlled amount of resin, and bound with a second set of perpendicular yarns.

Therefore, there is a need for a method and apparatus for forming a resin-impregnated fiber substrate capable of preserving the spaced-apart relationship between the machine and cross-direction yarns as they advance through the apparatus.

Therefore, there is also a need for an apparatus minimizing the number of contact points (i.e., stationary surfaces) over which yarns are drawn, to reduce the number of damaged yarns used to form the resulting substrate.

Therefore, a need also exists for a method and apparatus for continuously forming a resin-impregnated fiber substrate for composite structures wherein the amount of resin is controlled, the spaced-apart relationship is maintained, and the surface imperfections are minimized.

OBJECT AND SUMMARY OF THE INVENTION

Therefore, it is an object of the invention to provide a method for forming a resin-impregnated fiber substrate that is continuous in operation and capable of operating at high speeds (e.g., greater than eight) yards per minute per machine for a weft yarn count of forty per inch). It is another object of the invention to provide an apparatus for producing a continuous resin-impregnated fiber substrate that controls the amount of resin applied to the yarns, while maintaining the substantially parallel spaced-apart relationship between the yarns forming the substrate. It is a further object of the invention to reduce the number of surface imperfections on the resulting substrate to enhance the overall electrical properties of the composite structure (e.g., increased conductivity). The goal of the present invention is to develop a manufacturing process wherein a resin-impregnated fiber substrate is produced which can be molded into composites for structural and printed circuit boards having improved properties over composites manufactured with resin-impregnated woven fabrics.

Further, the present invention improves the economies of production by integrating and eliminated manufacturing processes into a single manufacturing process that converts bobbin yarns (i.e., beamed yarns) into a moldable resin-impregnated fiber substrate.

The product manufactured from the substrate produced by the present apparatus offers numerous advantages over conventional substrates manufactured from woven fabrics. In short, the present method imparts more uniform electrical properties and improved physical strength as compared to conventional substrates. In addition, the present apparatus and method enhances the dimensional stability and machine-ability of the resulting product.

Specifically, the claimed apparatus is designed to produce a fifty inch wide resin-impregnated composite substrate at a production speed of eight yards per minute per machine for a weft yarn count of forty yarns per inch. The apparatus is capable of using fifty denier yarn (e.g., glass yarn ECD 900 1/0) or greater for the machine or cross-direction yarn. The present apparatus offers enhanced flexibility because the warp and weft yarn count per inch can be varied independently of each other and can exceed sixty yarns per inch.

During the final stages of manufacture, the resin-impregnated fiber substrate produced by the present apparatus is taken up by rolls or cut into sheets of a specified length. Accordingly, the apparatus is capable of producing rolls of resin-impregnated fiber substrate greater than five hundred yards in length and fifty inches in width.

Furthermore, the claimed apparatus only requires thirty percent of the current floor space—including areas of raw materials, supplies, packing, shipping, etc.—required by conventional machines producing a resin-impregnated woven fabric from bobbins of yarn.

The overall capacity of the apparatus in producing a resin-impregnated composite substrate having a weft yarn count of forty yarns per inch is greater than three million yards per year operating for fifty weeks (assuming seven day work weeks) at eighty percent efficiency.

In a preferred embodiment, the use of ECG 75 1/0 fiberglass yarns in the present apparatus results in a resin-impregnated web having a yarn count of forty yarns per inch in the warp and weft directions, with forty-four percent by weight of FR-4 epoxy resin. The product would weigh approximately 11.2 ounces/square yard (e.g., 6.3 ounces of fiberglass and 4.9 ounces of resin) and have a thickness of approximately eight mils (i.e., 0.008 inches).

The substrate produced by the present invention embodies a structurally superior product as compared to conventional substrates. The apparatus is capable of producing a substrate having a warp and weft yarn count per inch of greater than sixty yarns per inch for each direction. The apparatus can use thermoset and thermoplastic resins and yarns as low as fifty denier (e.g., ECD 900 1/0). Thermoset resins suitable for use with the claimed invention include bismaleimide, cyanate ester, epoxy, melamine, polybutadiene, polyester, polyimide, phenolic, and vinyl ester. Further, the thermoplastic resins suitable for use in the present invention include acrylic, polyphenylsulfide, polytetrafluoroethylene, and polyvinyl chloride.

As a result of the improved method of applying resin to the yarns as they travel the longitudinal distance of the apparatus, the yarns are more completely covered and impregnated with resin as compared to conventional application methods. Accordingly, the improved method of applying resin enhances the structural stability of the composite formed therefrom. Structural stability of the resulting structure is further enhanced by the present method because the yarns forming the substrate are continuous and not interlaced. Dimensional stability may be further enhanced by requiring that the warp yarn count per inch and weft yarn count per inch be equal. In addition, composite structures formed with the present substrate are more stable because the current apparatus and method require a lower stress difference between the warp and weft direction than conventional apparatus and methods.

The present method of producing a resin-impregnated web for printed circuit boards and similar applications further benefits the composite structures formed from the resulting substrate. For example, the filaments of the yarn bundles are more homogeneously dispersed throughout the resulting composite structure, thereby enhancing the structural integrity of the substrate. Further, the composite structures made from the present method retain the perpendicular alignment of the machine and cross-direction yarns present in the web.

Composite structures made with the resulting web (e.g., electric circuit boards) retain more uniform electrical properties than those structures made with other woven and non-woven substrates because the present composite structure includes reduced surface defects and lacks a weave pattern. The present method also eliminates the migration of cations to the glass surface of the glass yarns because the present method eliminates the step of heat cleaning.

Composite structures made with the product have improved physical strength (e.g., tensile, compression, and flexure) as compared to composites made with other woven and non-woven substrates. The improved physical strength of the composite structure of the current method is partially due to the absence of interlaced yarns (i.e., the yarns are not bent). Further, the current method does not require that the yarns undergo a heat cleaning process to remove chemical additives, thereby reducing further deterioration (i.e., abrasion or surface damage) of the yarns. Moreover, lower resin to fiber volume fractions are obtainable due to the parallelism of the machine direction and cross-direction yarns, thereby reducing the amount of resin necessary to produce a composite suitable for a variety of structural applications.

The method for producing the resin-impregnated web includes the following steps: drawing machine direction yarns from a yarn supply contained in creels arranged around the hollow cylinder; passing the machine direction yarns from the creels through a circular collar or reed; advancing the machine direction yarns the length of the hollow cylinder's outer surface in a longitudinal direction; controlling the application of an uncured or partially cured thermoset or thermoplastic resin to the yarns as they travel upwards along the length of the hollow cylinder; winding cross-direction yarns around the periphery of the hollow cylinder and on top of the machine direction yarns, thereby forming a web; heating and cooling the resulting web; and finally collecting the web on a roll.

The cooling section of the cylinder lowers the temperature of the resin-coated yarns and prevents the resin-coated yarns from adhering to the surface of the cylinder. As a result of the cooling process, resin viscosity increases and the yarns are held in spatial relationship to each other. Once the yarns become stationary relative to one another, the circumference of the resin-impregnated web can then be slit or cut in the machine direction and removed from the hollow cylinder by carrier rolls. Synchronized draw rolls pull the individual widths of the resin-impregnated web from the cylinder. The resin-impregnated web can then be wound in rolls and later cut into sheets of desired dimensions. The sheets of the resin-impregnated web are then stacked and cured under pressure to produce a strong and stable composite.

The apparatus comprises a hollow cylinder for supporting a first series of yarns (i.e., machine direction yarns), a resin heater and pump for heating and pumping the resin to a circular hot melt resin die for applying resin to the yarns, a controller for controlling the amount of resin applied to the yarns, a rotating disk and roller assembly supported by a support disk and powered by an electro-magnet or series of electromagnets, a yarn supply containing cross-direction yarns supported by the rotating disk, circular heaters for promoting the curing of the resin-saturated yarns located around an upper portion of the cylinder, and cutting edges for cutting the resin-impregnated web into separate sections.

The present invention is unique in that the method claimed eliminates a number of steps involved in the conventional preparation of resin-impregnated fiber substrates. For example, the steps of weaving and finishing mentioned above in the first conventional method are eliminated. The present invention is economical and efficient, yet produces a flat bi-directional resin-impregnated substrate which maximizes the strength and stability of the molded composite.

In sum, the advantages of the present invention mentioned above eliminate the multiple steps discussed in the conventional methods (i.e., the weaving, finishing, and impregnating operations and/or the filament winding operations) and therefore increase efficiency of the entire process.

The foregoing and other objects and advantages of the invention and the manner in which the same are accomplished will become clearer based on the following detailed description taken in conjunction with the accompanying drawings in which:

BRIEF DESCRIPTION OF THE DRAWINGS

FIG. 5 is an exploded partial top plan view taken along lines 5—5 showing the relationship of the manifold containing liquid resin, a plurality of openings in communication with recessed channels on outer surface of the cylinder, and a supply of yarn supported by a disk adjacent the cylinder;

FIG. 6 is a partial top plan view taken along lines 6—6 showing heaters located at an upper portion of the cylinder heating the composite web and a water jacket secured to an interior portion of the cylinder;

FIG. 7 is an elevated side view taken along lines 7—7 showing a flared second end portion of cylinder, the water jacket, off-set carrier rolls, and section of the resulting composite resin-impregnated web.

FIG. 8 is a top plan view taken along lines 8—8 shown in FIG. 7 showing a cutter and the flared second end portion of the cylinder.

DETAILED DESCRIPTION OF THE INVENTION

Figure 1:
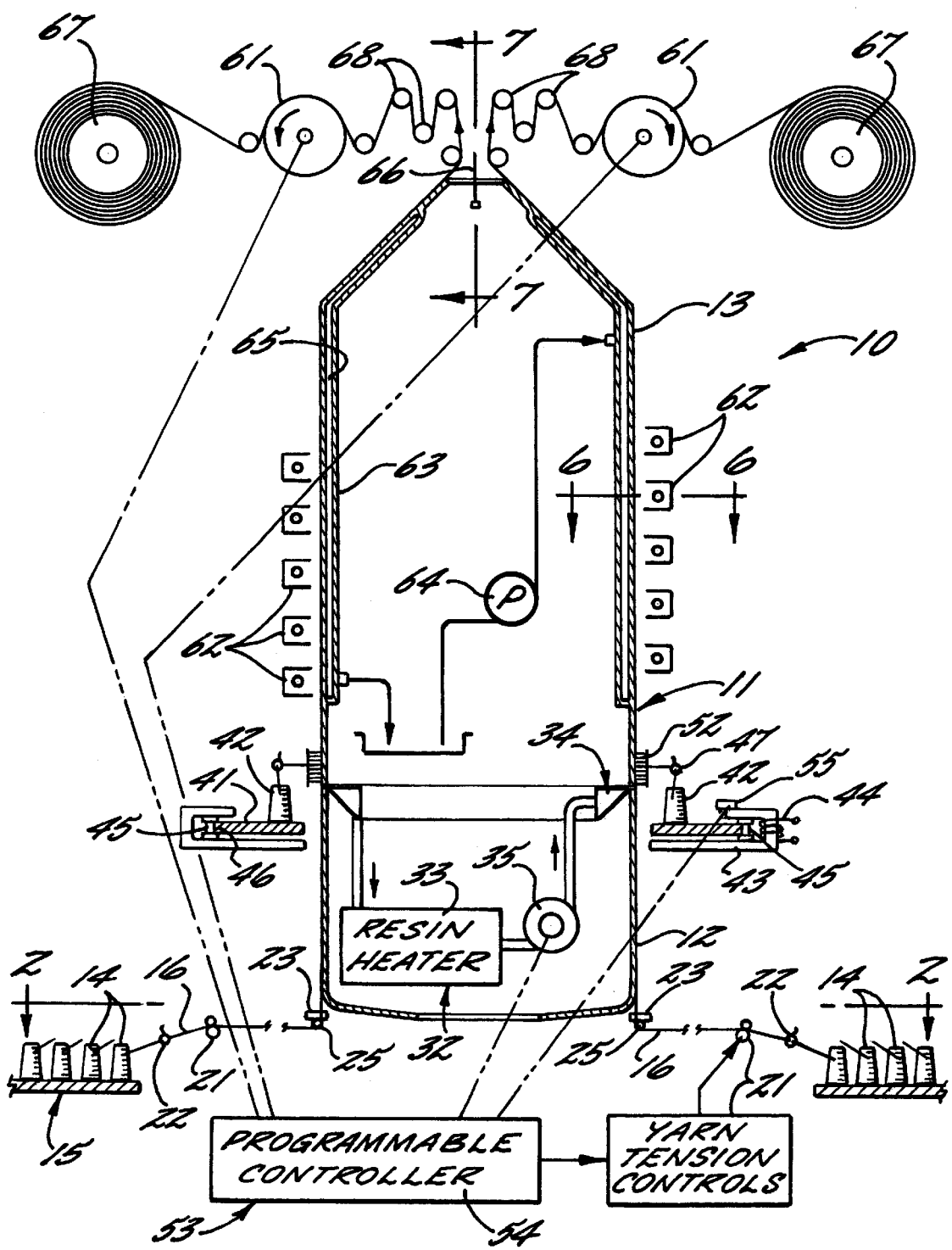
FIG. 1 is a side elevational view of the apparatus which incorporates the present invention.
Figure 2:
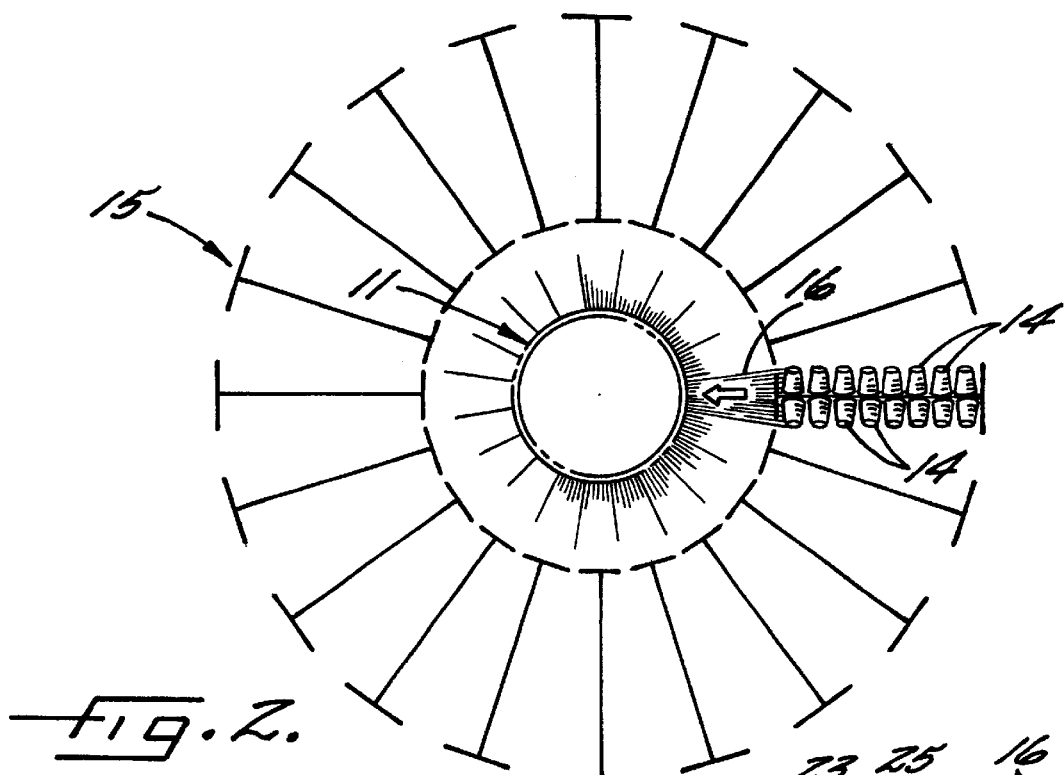
FIG. 2 is a top plan view taken along lines 2—2 of FIG. 1 showing a circular frame for supporting a supply of yarn on individual creels.

An overall view of the apparatus 10 for producing structurally improved resin-impregnated fiber webs for use in composites according to the present invention is set forth in FIG. 1. The apparatus includes an elongate hollow cylinder 11 having opposing end portions 12, 13. The hollow cylinder may be coated with a tetrafluoroethylene fluorocarbon polymer sold under the trademark TEFLON™, or other agents for preventing the adhesion of resin. The apparatus 10 includes a means for supplying yarn to the cylinder 11 illustrated as a plurality of creels 14 supported by an upper surface of a circular frame 15 in FIG. 2. The circular frame 15 defines an inside diameter larger than the outer diameter of the cylinder 11 such that the frame is positioned adjacent to the first end portion 12 of the hollow cylinder 11. Thus, the plurality of creels 14 are disposed about the periphery of the hollow cylinder 11 as shown in FIGS. 1 and 2. In a further embodiment of the present invention, yarns for the machine direction may be delivered from beams of yarns. A variety of yarns may be used in the present invention to include yarns comprised of aramid, carbon, fiberglass, metal, nylon, polyester or quartz.

Referring to FIG. 1, the apparatus 10 further includes a means between the creels 14 and hollow cylinder 11 for guiding the yarn ends from the creels to the surface of the first end portion 12 of the cylinder 11 comprised of a collar or reed 23 positioned co-axial to the cylinder. A plurality of guides 22 and tension devices 21 for guiding the yarn ends 16 from the creels 14 to the collar 23 while maintaining sufficient tension and spacing are located between the creels and collar. The collar 23 includes an inner and outer circumferential surface and an upper 26 and lower rim 27.

Figures 3, 4:
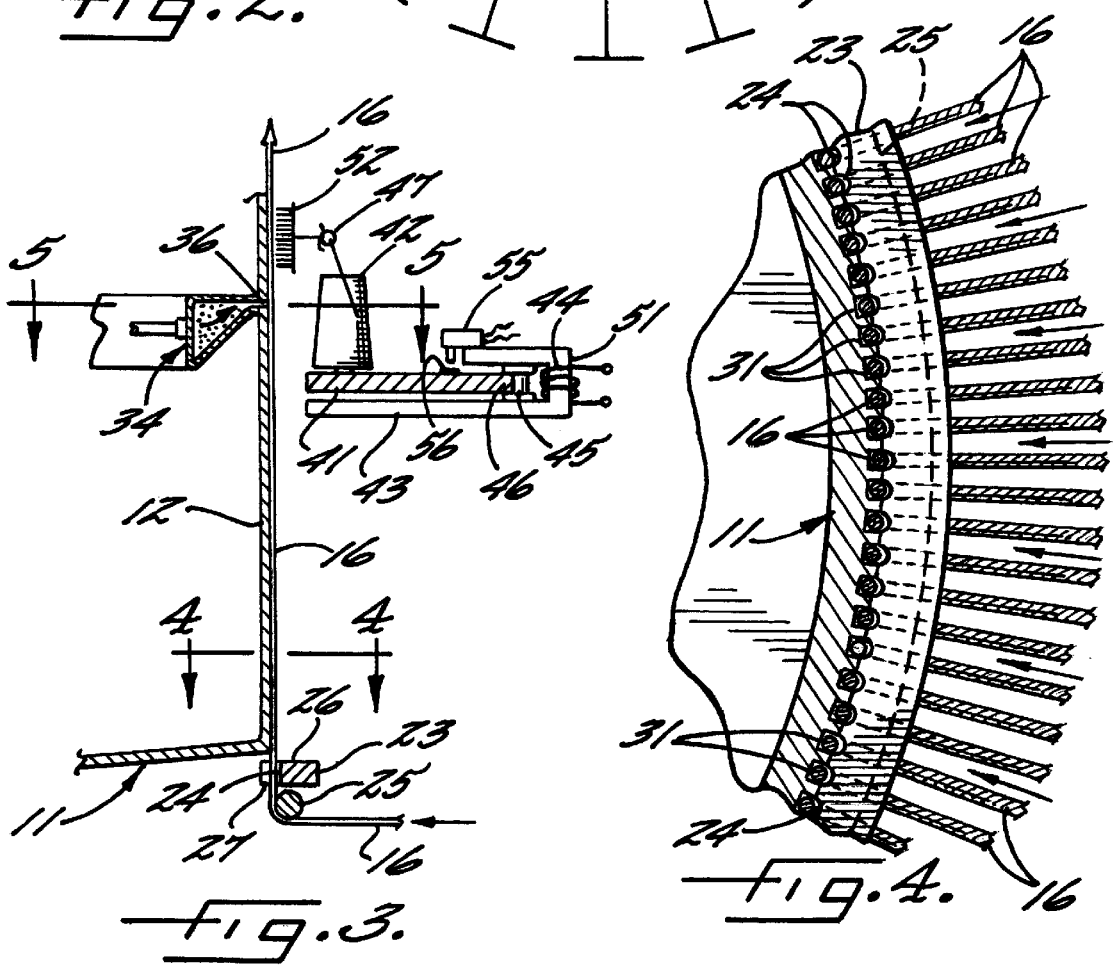
FIG. 3 is a partial cross-section view showing the relationship of a collar for directing yarn ends along a hollow cylinder, a disk for winding transverse yarns around the longitudinal yarns, and a resin manifold for depositing liquid resin into recessed channels.
FIG. 4 is a partial top plan view taken along lines 4—4 showing the longitudinal yarns passing through dents on the interior surface of the collar and into the recessed channels along the outer surface of the cylinder at spaced intervals.

As shown in more detail in FIG. 3, the lower rim 27 of the collar 23 defines a bushing 25 that directs the yarn ends 16 from the creels 14 to a plurality of dents 24 defined by the inner circumferential surface of the collar upwardly in a vertical direction. As depicted in FIG. 4, the plurality of dents 24 is spaced apart substantially in parallel relationship to one another about the inner surface of the collar 23. The dents 24 guide the yarn ends 16 from the bushing 25 to the outer surface of the first end portion 12 of the cylinder 11 while maintaining the parallel spaced relationship of the yarn ends 16 with respect to one another. In this fashion, the yarn ends 16 are directed upwardly by the bushing 25 before being separated and spaced substantially in parallel relationship to one another by the plurality of dents 24. In this preferred embodiment, the collar 23 is positioned such that the dents 24 extend parallel to the surface of the hollow cylinder 11. It should be understood that the collar 23 is not limited in diameter or the number of dents per inch.

As illustrated in FIG. 4, the apparatus 10 further includes a means for guiding the yarn ends 16 longitudinally (i.e., in the machine direction) along the outer surface of the cylinder 11 illustrated as a plurality of recessed channels 31 spaced substantially in parallel relationship to one another located about the surface of the cylinder 11. The recessed channels 31 extend longitudinally along the surface of the cylinder and continuously align the yarn ends 16 in parallel spaced relationship as the yarn ends advance upwardly from the first end portion 12 of the cylinder to the second end portion 13 of the cylinder.

The apparatus 10 also includes a means for applying uncured or partially cured liquid resin to the machine direction yarns as the yarns move along the recessed channels 31 of vessel 32 for retaining uncured liquid or solid resin, a resin heater 33 for heating the liquid resin or melting the solid resin in the heater, a manifold 34 for delivering the heated resin from the vessel 32 to the interior of the cylinder 11, and a pump 35 for pumping the heated liquid resin from the vessel 32 to the manifold 34. It will be understood that the term uncured resin refers to resin that is not in a solid form to include partially cured resin. As shown in more detail in FIGS. 3 and 5, the manifold 34 includes of a plurality of openings 36 located between the inner and outer surface of the manifold. In this configuration, the vessel 32, resin heater 33, manifold 34, and pump 35 are located within the interior of the hollow cylinder 11. Although the manifold 34 of the present invention is positioned within the interior of the hollow cylinder, the vessel 32, resin heater 33, and pump 34 may be placed external to the hollow cylinder to facilitate accessibility to the same during repair or cleaning.

The plurality of recessed channels 31 along the outer surface of the cylinder 11 further comprise a plurality of openings 37 defining a passageway between the inner and outer surface of the cylinder 11 (see FIG. 5). The plurality of openings 37 in the recessed channels 31 are adjacent to and in communication with the plurality of openings 36 in the manifold, thereby allowing liquid resin to be delivered from the manifold 34 through the openings 37 and to the machine direction yarns as they advance upwardly along the outer surface of the hollow cylinder 11 in the recessed channels 31. The resin is applied to the yarns in their parallel spaced relationship on the cylinder 11.

The apparatus 10 as shown in FIG. 3 further includes a means for winding cross-direction yarns around the hollow cylinder 11 comprised of a disk 41 for supporting a yarn supply 42 positioned on the upper surface of a stationary support ring 43. In a preferred embodiment, the yarn winding means includes an electromagnetic actuator or actuators 44 for rotating the disk 41 around the outer circumference of the cylinder 11 while the disk rests upon a plurality of rollers or spools 45 having flanged ends and mounted along the outer edges of the support ring 43. In this configuration, the outer edges 46 of the rotating disk are supported by the flanged ends of the rollers 45. Accordingly, the rollers 45 promote the rotation of the rotating disk 41 at relatively high speeds while restricting the lateral movement of the disk as it rotates about the circumference of the hollow cylinder 11.

Further, the flanged ends of the rollers 45 maintain the rotating disk in a stationary position coplanar with the support ring 43.

In yet another embodiment, ball bearings may be displaced between the lower surface of the disk 41 and the upper surface of the stationary support ring 43 to promote rotation of the disk about the hollow cylinder 11. In other embodiments of the present invention, the rotating disk 41 may also be propelled by belts or electric motors (not shown).

In this preferred embodiment, the outer edge portions 46 of the disk 41 include ferrous metals. The electromagnetic force generated by the electromagnetic actuator acts upon the ferrous metals contained in the outer edge portions 46 of the disk 41 and, thereby, propel the disk around the hollow cylinder 11. In yet another embodiment, the disk 41 may include a raised rim on its outer periphery for supporting packages or creels of yarn at an angle or perpendicular to the hollow cylinder 11.

As depicted in FIG. 3, electromagnetic actuators 44 are positioned on an outer edge portion 51 of the support ring 43. The yarn aligning means further includes a tension device 47 for maintaining sufficient tension as the transverse yarn travels from the yarn supply 42 to a comb 52. The comb 52 guides the cross-direction yarns onto the machine direction yarns advancing along the hollow cylinder 11 in an overlying relationship while maintaining the yarns in their substantially spaced apart parallel relationship.

The apparatus 10 further includes a means for controlling the delivery rate of machine direction yarn from the yarn creels 14 to the cylinder 11 comprised of a programmable controller or microprocessor 53. The desired structure of the resulting composite web is defined by the parameters stored in the microprocessor by the operator. The microprocessor is in communication with draw rolls 61 that draw the machine direction yarns from the yarn creels 14 and along the surface of the cylinder 11. The draw rolls 61 located adjacent two sides of the cylinder pull the machine direction yarns at equal rates as determined by the signal from the microprocessor. In addition, the apparatus includes a means for metering or controlling the amount of resin delivered from the resin vessel 32 to the machine direction yarns on the cylinder 11 comprised of a controller 54.

The resin controller specifically controls the amount of resin coating to be applied to the machine direction yarns, thereby determining the resin to fiber volume fraction of the resulting web. The microprocessor 53 and controller 54 are in communication with a means for detecting the delivery rate of transverse yarns from the yarn supply 42 comprised of a sensor 55 located adjacent the electromagnetic actuator 44. As shown in FIG. 3, in a preferred embodiment the sensor 55 is an electro-optic device capable of detecting an indicator mark 56 located on the upper portion of the rotating disk 41 as the mark repeatedly presents itself to the sensor. In operation, the sensor 55 identifies the rate at which the indicator mark 56 presents itself to the sensor and then delivers a signal to the microprocessor 53 and controller 54. The microprocessor, in turn sends a signal to the draw rolls 61 that control the speed at which the machine direction yarns are advanced along the exterior of the hollow cylinder 11.

In this configuration, the microprocessor 53 is responsive to the signal delivered by the sensor 55 which identifies the rate at which cross-direction yarns are wound around the machine direction yarns on the cylinder 11 such that the resin controller 54 adjusts the amount of resin delivered from the manifold 34 into the plurality of openings 37 located in the recessed channels 31 and onto the machine direction yarns.

As shown in FIG. 1, the overall configuration of the apparatus 10 is such that the hollow cylinder 11, the yarn creels 14, the circular collar or reed 23, and the rotating disk 41 containing yarn supply 42 are coaxially-disposed to one another. In this configuration, the machine direction yarn ends 16 travel continuously from the creels 14 to the outer surface of the cylinder 11 through the collar 23 while cross-direction yarns from the circular disk 41 are wound transversely to and in an overlying relationship with the machine direction yarns advancing upwardly along the outer surface of the cylinder 11.

The apparatus 10 further includes a means for partially curing the resin-impregnated web comprised of circular heaters 62 located adjacent the second end portion 13 of the hollow cylinder 11. The partial curing of the web partially sets the machine direction and cross-direction yarns in a spatial relationship, thereby imparting characteristics beneficial to products made from the resulting web such as printed circuit boards (e.g., improved conductivity due to reduced imperfections on the surface of the substrate).

The apparatus 10 further comprises means for preventing adhesion between the outer surface of the second end portion 13 of the cylinder 11 and the partially cured longitudinal and transverse yarns comprised of a hollow water jacket 63. In a preferred embodiment, the water jacket 63 is secured to an interior portion of the hollow cylinder 11 as shown in FIG. 1. As depicted in FIGS. 1 and 7, a pump 64 circulates cooling water into a chamber 65 formed by the water jacket 63 to cool the outer surface of the second end portion 13 of the hollow cylinder 11, thereby preventing the partially cured web from adhering to the outer surface of the hollow cylinder 11. Any conventional refrigerant that results in the formation of condensation may be circulated in the chamber 65 to prevent the resin-coated yarn 16 from adhering to the hollow cylinder 11.

The apparatus 10 further includes a means for separating sections of the substrate formed by the partially cured web comprised of a plurality of cutting edges 66 located adjacent the upper end of the second end portion 13 of the cylinder 11 as shown in FIG. 8. The cutting edges 66 separate the resin-impregnated web, as the web continuously advances along the cylinder, thereby allowing the separate sections of the web to be drawn by draw rolls 61 through off-set carrier rolls 68 and onto take-up rolls 67 for later use.

It will be further understood that the invention comprises the method for continuously producing structurally improved resin-impregnated webs. The method comprises directing a plurality of yarn ends from a plurality of yarn creels to a hollow cylinder while maintaining the yarn ends in substantially spaced apart parallel relationship as the yarn ends are advanced in the machine direction. The method further comprises winding cross direction yarns transversely to and in close overlying relationship with the yarn ends travelling in the machine direction while applying resin to the machine direction and cross-direction yarns. Finally, the method comprises maintaining the substantially parallel spaced apart relationship while partially curing the applied resin to thereby produce a partially cured web from the resin, machine direction yarns, and cross-direction yarns.

In the preferred embodiments, the method comprises drawing yarns for the machine direction from the creels 14 that are placed at spaced apart intervals around exterior of the hollow cylinder 11. The yarns are drawn by the draw rolls 61 positioned at an elevated height above the hollow cylinder 11. Yarn tension devices 21 and guides 22 previously described provide sufficient tension to the yarn as the yarns are guided to the collar 23 located adjacent the first end portion 12 of the cylinder 11.

In the preferred embodiments, the step of maintaining the yarn ends in substantially spaced apart parallel relationship comprises moving the yarn ends from the tension devices 21 and guides 22 to the bushing 25 formed by the lower rim 27 of the collar 23. The bushing 25 directs the horizontally oriented machine direction yarns from the yarn supply to the dents 24 on the interior surface of the collar 23 by directing the yarns upward in a vertical direction. The dents 24 on the collar separate and space the individual machine direction yarn ends 16 into a substantially spaced apart parallel relationship to one another as the yarn moves over the bushing 25 from the exterior to the interior of the collar. The dents 24 then direct the vertically oriented machine direction yarns from the interior of the collar 23 to the outer surface of the first end portion of the hollow cylinder 11.

The tension provided by the tension devices 21 in conjunction with the dents 24 on the collar 23 maintain the substantially spaced apart parallel relationship of the machine direction yarns entering the interior of the collar as the yarn advances over the bushing 25. In the preferred embodiment, the outside diameter of the hollow cylinder 11 is approximately equivalent to the inside diameter of the collar.

As shown in a preferred embodiment in FIG. 4, the dents 24 on the interior surface of the collar 23 are aligned with the recessed channels 31 positioned along the outer surface of the cylinder 1. Accordingly, the bushing 25 and collar 23 direct the horizontally oriented yarns from the creels 14 upward in a vertical orientation while simultaneously aligning the vertically oriented yarns with the recessed channels 31 on the surface of the cylinder 11. The machine direction yarns are then subsequently and continuously aligned in a spaced apart relationship on the hollow cylinder 11 by the recessed channels 31 as the yarn ends advance along the cylinder.

Next, the step of applying resin comprises heating the resin in the vessel 32, pumping the liquid resin from the vessel to the manifold 34, and thereafter delivering the heated liquid resin from the manifold into the recessed channels containing the machine direction yarns. The pump 35 pumps the heated, liquid resin from the vessel 32 to the manifold 34 and into the plurality of openings 36 which are in fluid communication with the plurality of openings 37 in the recessed channels 31. Advantageously, the longitudinal yarns are more completely coated and impregnated with resin as compared to conventional methods (e.g., spraying an interior portion of the yarns) because the resin flows into the channels and around the surface of the machine direction yarns as the yarns travel in a substantially spaced apart parallel relationship to one another the length of the hollow cylinder 11. As discussed later, the amount of resin delivered to the machine direction yarns is determined by the speed at which the cross-direction yarns are would around the cylinder.

The step of winding comprises winding cross-direction yarns transversely to and in close overlaying relationship with the machine direction yarns advancing along the cylinder in the recessed channels 31. The step of winding further includes actuating the disk 41 containing the yarn supply 42 located adjacent the cylinder 11 by providing a current to the electromagnetic actuator 44. In the preferred embodiment illustrated in FIGS. 1 and 3, rotation of the disk 41 is caused by electromagnetic forces acting on the outer edge portion 46 of the disk containing ferrous metals. The electromagnetic force is generated by positioning stationery electromagnets around the support ring powered by a power source (not shown). By controlling the supply of power, the operator is able to control the speed at which the disk 41 rotates. The disk 41 is supported by rollers 45 having flanged ends mounted to an upper surface of the stationary ring 43.

The tension device 47 secured to the disk 41 ensures that the cross-direction yarns are guided to the comb 52 under sufficient tension. The comb 52 guides the cross-direction yarns onto the machine direction yarns at spaced intervals as the machine direction yarns advance upward along the outer surface of the cylinder 11.

The step of directing the machine direction yarns from the creels 14 and to the surface of the cylinder 11 are controlled by the programmable controller 53. The programmable controller includes a microprocessor in communication with the sensor 55 secured to a portion of the yarn winding means. The operator is able to control the structure of the resulting resin-impregnated fiber web by programming the rate at which the machine direction yarns are drawn along the surface of the cylinder and the amount of resin applied thereto.

To initiate operation of the apparatus, the operator activates a power source (not shown) which in turn generates a current that actuates the electromagnetic actuator 44. The amount of power supplied to the electromagnetic actuator 44 determines that speed at which the disk 41 rotates. As the disk 41 rotates, the indicator mark 56 on the disk repeatedly presents itself to the sensor 55. Next, the sensor 55 sends a signal to the microprocessor that calculates the speed at which the disk 41 is rotating. Upon determining the rate at which the disk is rotating, the microprocessor 53 sends a signal to the draw roll 61, thereby rotating the roll and pulling the yarn from the yarn creels and along the cylinder at a rate to produce a web having the desired characteristics as input by the operator into the microprocessor.

As referenced above, the programmable controller 53 is in communication with a resin controller 54 for controlling the amount of resin applied to the machine direction yarns. As shown in FIGS. 1 and 3, the signal from the sensor 55 informs the programmable controller 53 of the rotation rate of the disk 41. In turn the programmable controller 53 sends a signal to the resin controller 54 indicating the amount of resin to be applied according to the predetermined resin to fiber volume fraction selected by the operator. The amount of resin required to produce a resin-impregnated web of the desired weight is then delivered from the resin vessel 32 to the machine direction yarns in the recessed channels 31 through the openings 36 in the resin manifold 34 that are in communication with the recessed channels.

In short, the revolutions per minute (rpm) of the rotating disk, the number of packages of yarn on the disk, and the speed of the yarns advancing in the machine direction are variables provided to the controller that, in turn, controls the number of yarns per inch provided by the yarn winding means to the hollow cylinder 11 in the cross-machine direction.

The curing step comprises heating the resin-impregnated web as the web advances along the hollow cylinder 11 to partially cure the resin. Heat is applied by the circular electrical heaters 62 located adjacent an upper portion of the cylinder. The water jacket 63 cools the exterior of the cylinder adjacent the resin coated machine direction and cross-direction yarns to prevent the resin-impregnated web from adhering to the outer surface of the cylinder. The step of cooling further comprises continuously circulating cool water within the water jacket 63. The step of cooling thereby increases the viscosity of the resin to maintain the yarns in spatial relationship to each other.

While the yarns continue along the second end portion 13 of the cylinder 11, they are sufficiently held in place by the partially cured resin. As depicted in the preferred embodiment shown in FIGS. 7 and 8, the outside diameter of the hollow cylinder 11 is flared, thus creating two flat surfaces at the second end portion of the cylinder. Upon reaching the second end portion 13 of the cylinder 11, the circumference of the partially cured resin-impregnated web is slit by the cutting edges 66 oriented in the machine direction at the edges of the flared hollow cylinder, thus creating two continuous flat resin-impregnated webs.

Next, each continuous flat partially cured resin-impregnated fiber web is removed from the hollow cylinder by the draw rolls 61 after passing through the series of offset carrier rolls 68. Thereafter, each individual width of the flat partially cured resin-impregnated fiber web is collected on its respective collecting roll 67. Each draw roll 61 is synchronized with the opposite draw roll according to the signal delivered from the programmable controller. The resulting sections of resin-impregnated fiber web are later cut into sheets of desired dimensions. The sheets of the flat partially cured resin-impregnated fiber web are then stacked and cured under pressure and temperatures to produce, for example, a cured reinforced composite for structural or printed circuit applications.

Projected Results

In projecting results according to the present invention and method, epoxy compatible fiberglass yarns for the machine direction are drawn from nineteen creels 14 placed at eighteen degree intervals around a thirty-two inch outside diameter hollow cylinder 11. Each of the nineteen creels is capable of holding one-hundred-and-sixty twenty pound packages of yarn per side. Therefore, the nineteen creels have the capacity to support six thousand eight hundred and forty packages of yarn for the machine direction. Placement of the nineteen creels at eighteen degree intervals around the thirty-two inch cylinder creates a sufficient opening to access the thirty-two inch outside diameter hollow cylinder.

Next, the machine direction yarn will travel from the packages on the creels 14 through yarn tension devices 21 and guides 22 to the circular collar 23 having a thirty-three inch inside diameter. The circular collar 23 includes four thousand and twenty-one dents 24 positioned about the periphery of the collar 23. The collar separates and spaces the individual yarn ends into a substantially spaced apart parallel relationship to one another around the hollow cylinder.

In an exemplary projection, 4,021 yarns (corresponding to the same number of dents in the collar, i.e., one yarn per dent) yielded a resin-impregnated fiber web having forty yarns per inch in the machine direction. The machine direction yarns travel along the thirty-two inch outside diameter hollow cylinder from the thirty-three inch inside diameter circular collar having a one-half inch curvature bushing or rod.

The composite disk 41 having a thirty-six inch inside diameter, a fifty-eight inch outside diameter, and a thickness of three-quarters of an inch may be rotated up to 600 revolutions per minute (rpm) around the 32-inch hollow cylinder containing the resin impregnated yarns moving in the machine direction. The disk 41 is capable of supporting fifteen twenty pound packages of epoxy resin compatible fiberglass yarn.

The microprocessor 53 controlling the draw rolls 61 causes the yarns and machine direction to advance in a continuous motion of $15/40$ of an inch for each revolution of the disk, resulting in forty yarns per inch across in the machine direction. Upon reaching the upper end of the second end portion 13 of the cylinder, the circumference of the partially cured epoxy resin impregnated fiberglass web is slit by the cutting edges 66 in the machine direction at the edges of the flared hollow cylinder, thus creating two continuous flat resin impregnated fiberglass webs of 50.25 inches wide. Next, the web is drawn through a plurality of offset carrier rolls 68, draw rolls 61 and collecting rolls 67. The carrier rolls 68 are offset from each other by $15/80$ of an inch per 50.25-inch length to maintain a perpendicular relationship between the cross-direction yarns and machine direction yarns.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. An apparatus for producing structurally-improved resin-impregnated fiber substrate for printed circuit boards and reinforced plastic composites, said device comprising
   a cylinder having first and second opposed end portions and defining a central axis;
   means for supplying a plurality of yarn ends to said cylinder;
   a collar adjacent said first end portion of said cylinder having an inner circumferential surface an outer circumferential surface an upper rim, and a lower rim, said collar having an inside diameter substantially equivalent to the outside diameter of said cylinder;
   a plurality of dents formed in said collar and spaced apart substantially in parallel relationship to one another about said inner surface of said collar;
   means for guiding the plurality of yarn ends longitudinally along said surface of said cylinder from said first end portion to said second end portion in their substantially parallel spaced relationship to one another;
   means for winding other yarns around said cylinder transversely to and in close overlying relationship with the longitudinally-guided yarns;
   means for applying a liquid resin to the longitudinal yarns while the yarns are on said cylinder and while maintaining the parallel spaced relationship of the longitudinal yarns on said cylinder; and
   means for separating, sections of a substrate formed by partially curing, the longitudinal and transverse yarns as the substrate advances along the outer surface of said cylinder;
   wherein said lower rim of said collar defines a bushing for directing the yarn ends from said yarn supply to said inner circumferential surface of said collar in an upward direction;
   wherein said plurality of dents are positioned such that the yarn ends are guided from said yarn supply to the surface of said first end portion of said cylinder while maintaining the parallel spaced relationship of the yarn ends to one another.

2. An apparatus according to claim 1 further comprising a means for partially curing the resin while the yarns are on said cylinder in the substantially parallel spaced relationship substantially to thereby maintain the relationship in the partially cured substrate.

3. An apparatus according to claim 1 wherein said yarn guiding means comprises a plurality of recessed channels spaced substantially in parallel relationship to one another about said surface of said cylinder and extending longitudinally along at least a portion of said surface of said cylinder for continuously aligning the plurality of longitudinal yarn ends in parallel spaced relationship as they advance upwardly from said first end portion of said cylinder to said second end portion of said cylinder.

4. An apparatus according to claim 3 wherein:
   said cylinder is hollow and has an inner circumferential surface;
   said resin applying means is positioned adjacent said inner circumferential surface; and
   wherein said plurality of recessed channels further comprise a plurality of openings communicating between said inner and outer surfaces of said cylinder for delivering liquid resin from said resin applying means through said openings and to the transverse and longitudinal yarns.

5. An apparatus according to claim 1 wherein said yarn supplying means comprises a circular frame for supporting a plurality of yarn creels adjacent said cylinder.

6. An apparatus according to claim 5 wherein said circular frame defines an opening for receiving at least a portion of said first end portion of said hollow cylinder.

7. An apparatus according to claim 1 wherein said resin applying means comprises
   a vessel for containing uncured or partially cured liquid or solid resin;
   means for heating the resin contained in said vessel;
   a manifold for delivering the resin from said vessel to said interior of said cylinder;
   pump means for pumping resin from the vessel to said manifold; and
   wherein said manifold is hollow and has an inner and outer surface;
   wherein said manifold further comprises a plurality of openings between said inner and outer surface adjacent to and in communication with said yarn guiding means.

8. An apparatus according to claim 1 wherein said yarn winding means comprises
   a disk for supporting a yarn supply having an upper and lower surface;
   a stationary support ring for supporting said disk having an outside diameter greater than the outside diameter of said disk, said support ring having an upper and lower surface;
   means for moving said disk around said cylinder; and
   means mounted on said upper surface of said support ring for facilitating the movement of said disk as it travels around said cylinder.

9. An apparatus according to claim 8 wherein outer edge portions of said disk comprise ferrous metals.

10. An apparatus according to claim 8 wherein said moving means comprises electromagnetic actuators adjacent an outer edge portion of said disk.

11. An apparatus according to claim 8 wherein said facilitating means comprises a plurality of cylindrical rollers having flanged ends mounted on edge portions of said stationary support ring for supporting said disk as it moves around said cylinder.

12. An apparatus according to claim 8 wherein said facilitating means comprises ball bearings or shot.

13. An apparatus according to claim 1 further comprising:
   means for controlling the delivery rate of yarn from said yarn supplying means to said cylinder;
   means for metering the amount of resin delivered to the longitudinal and transverse yarns adjacent said yarn controlling means;
   means for detecting the delivery rate of transverse yarns from said yarn winding means to said cylinder adjacent and delivering a signal to said yarn controlling means and said resin metering means positioned adjacent said yarn winding means; and
   wherein said yarn controlling means, said detecting means, and said resin metering means are in communication.

14. An apparatus according to claim 13 wherein said yarn controlling means is responsive to said detecting and delivering means such that said yarn controlling means adjusts the rate at which longitudinal yarns are advanced from said first end portion of said cylinder to said second end portion of said cylinder according to a desired yarn count of resulting substrate.

15. An apparatus according to claim 13 wherein said resin metering means is responsive to said detecting and delivering means such that said resin metering means adjusts the amount of resin applied to the yarn ends and the transverse yarns located along the outer surface of said cylinder.

16. An apparatus according to claim 1 wherein said cylinder, said yarn supplying means, said yarn guiding means, and yarn winding means are coaxially disposed to one another so that the longitudinal yarn travels from said yarn supplying means and to said outer surface of said cylinder through said yarn guiding means while other yarns from said yarn winding means are wound transversely to and in close overlying relationship with the longitudinal yarns advancing upwardly along said outer surface of said cylinder.

17. An apparatus according to claim 1 further comprising a means for partially curing the resin-coated longitudinal and transverse yarns as the resin-coated yarns advance along said hollow cylinder while maintaining their substantially parallel spaced-apart relationship to one another.

18. An apparatus according to claim 17 wherein said partially curing means comprises a plurality of heaters adjacent said second end portion of said cylinder.

19. An apparatus according to claim 1 further comprising a means for preventing adhesion between the outer surface of said second end portion of said cylinder and the partially cured longitudinal and transverse yarns.

20. An apparatus according to claim 19 wherein said adhesion preventing means comprises a hollow water jacket secured to the interior of said second end portion of said cylinder.

21. An apparatus according to claim 1 wherein said separating means comprises a plurality of cutting edges adjacent said second end portion of said cylinder.

22. An apparatus for producing structurally-improved resin-impregnated fiber substrate for printed circuit boards and reinforced plastic composites, said device comprising
   a cylinder having first and second opposed end portions and defining a central axis;
   mean s for supplying a plurality of yarn ends to said cylinder;
   means between said yarn supply and said cylinder for guiding the yarn ends from said yarn supply to an outer surface of said first end portion of said cylinder in spaced substantially parallel relationship to one another around the circumference of said cylinder;
   means for guiding the plurality of yarn ends longitudinally along said outer surface of said cylinder from said first end portion to said second end portion in substantially parallel spaced relationship to one another;
   a disk for supporting a yarn supply having an upper and lower surface;
   a stationary support ring for supporting said disk having an outside diameter greater than the outside diameter of said disk, said support ring having an upper and lower surface;
   means for moving said disk around said cylinder;
   a plurality of cylindrical rollers mounted on said upper surface of said support ring for facilitating the movement of said disk as it travels around said cylinder, said cylindrical rollers having flanged ends mounted on edge portions of said stationary support ring for supporting said disk as it moves around said cylinder;
   means for applying a liquid resin to the longitudinal yarns while the yarns are on said cylinder and while maintaining the parallel spaced relationship of the longitudinal yarns on said cylinder, said resin applying means positioned adjacent an inner surface of said cylinder; and
   means for separating sections of a substrate formed by partially curing the longitudinal and transverse yarns as the substrate advances along the outer surface of said cylinder.

23. An apparatus according to claim 22 further comprising a means for partially curing the resin while the yarns are on said cylinder in the substantially parallel spaced relationship substantially to thereby maintain the relationship in the partially cured substrate.

24. An apparatus according to claim 22 wherein said means for guiding the yarn ends from said yarn supply to the surface of said cylinder comprises a collar adjacent said first end portion of said cylinder having an inner and outer circumferential surface and an upper and lower rim, said collar having an inside diameter substantially equivalent to the outside diameter of said cylinder.

25. An apparatus according to claim 24 wherein said inner circumferential surface of said collar includes a plurality of dents spaced apart substantially in parallel relationship to one another about said inner surface of said collar for guiding yarn ends from said yarn supply to the surface of said first end portion of said cylinder while maintaining the parallel spaced relationship of the yarn ends to one another.

26. An apparatus according to claim 22 wherein said means for guiding the plurality of yarns longitudinally along said cylinder comprises a plurality of recessed channels spaced substantially in parallel relationship to one another about said surface of said cylinder and extending longitudinally along at least a portion of said surface of said cylinder for continuously aligning the plurality of longitudinal yarn ends in parallel spaced relationship as they advance upwardly from said first end portion of said cylinder to said second end portion of said cylinder,
   said channels having a plurality of openings communicating between inner and outer surfaces of said cylinder for delivering liquid resin from said resin applying means through said openings and to the transverse and longitudinal yarns.

27. An apparatus according to claim 26 wherein said resin applying means comprises:

a vessel for containing uncured or partially cured liquid or solid resin;

means for heating the resin contained in said vessel;

a manifold for delivering the resin from said vessel to said inner surface of said cylinder; and pump means for pumping resin from said vessel to said manifold;

wherein said manifold is hollow and has an inner and outer surface;

wherein said manifold further comprises a plurality of openings between said inner and outer surface adjacent to and in communication with said plurality of openings in said recessed channels.

28. An apparatus according to claim 22 further comprising:

means for controlling the delivery rate of yarn from said yarn supplying means to said cylinder;

means for metering the amount of resin delivered to the longitudinal and transverse yarns adjacent said yarn controlling means; and means for detecting the delivery rate of transverse yarns from said yarn winding means to said cylinder adjacent and delivering a signal to said yarn controlling means and said resin metering means positioned adjacent said yarn winding means;

wherein said yarn controlling means, said detecting means, and said resin metering means are in communication.

29. An apparatus according to claim 28 wherein:

said yarn controlling means is responsive to said detecting and delivering means such that said yarn controlling means adjusts the rate at which longitudinal yarns are advanced from said first end portion of said cylinder to said second end portion of said cylinder according to a desired yarn count of resulting substrate; and said resin metering means is responsive to said detecting and delivering means such that said resin metering means adjusts the amount of resin applied to the yarn ends and the transverse yarns along the outer surface of said cylinder.

30. An apparatus according to claim 22 further comprising:

a plurality of heaters for partially curing the resin-coated longitudinal and transverse yarns as the resin-coated yarns advance along said hollow cylinder while maintaining their substantially parallel spaced-apart relationship to one another, said plurality of heaters positioned adjacent said second end portion of said cylinder; and a means for preventing adhesion between the outer surface of said second end portion of said cylinder and the partially cured longitudinal and transverse yarns.

31. An apparatus according to claim 22 wherein said separating means comprises a plurality of cutting edges adjacent said second end portion of said cylinder.

32. An apparatus according to claim 22 wherein:

outer edge portions of said disk comprise ferrous metals, and said moving means comprises electromagnetic actuators adjacent an outer ed portion of said disk, such that electromagnetic force generated by said actuators advances said disk around said cylinder.

33. An apparatus for producing structurally-improved resin-impregnated fiber substrate for printed circuit boards and reinforced plastic composites, said device comprising:

a cylinder having, first and second opposed end portions and defining a central axis;

means for supplying a plurality of yarn ends to said cylinder;

means between said yarn supply and said cylinder for guiding, the yarn ends from said yarn supply to the surface of said cylinder at said first end portion of said cylinder in spaced substantially parallel relationship to one another around the circumference of said cylinder;

means for guiding the plurality of yarn ends longitudinally along, said surface of said cylinder from said first end portion to said second end portion in their substantially parallel spaced relationship to one another;

a disk for supporting a yarn supply having an upper and lower surface;

a stationary support ring for supporting said disk having an outside diameter greater than the outside diameter of said disk, said support ring having an upper and lower surface;

means for moving said disk around said cylinder;

ball bearings positioned on said upper surface of said support ring for facilitating the movement of said disk as it travels around said cylinder;

means for applying a liquid resin to the longitudinal yarns while the yarns are on said cylinder and while maintaining the parallel spaced relationship of the longitudinal yarns on said cylinder; and means for separating sections of a substrate formed by partially curing the longitudinal and transverse yarns as the substrate advances along the outer surface of said cylinder.

34. An apparatus for producing structurally-improved resin-impregnated fiber substrate for printed circuit boards and reinforced plastic composites, said device comprising:

a cylinder having first and second opposed end portions and defining a central axis;

means for supplying a plurality of yarn ends to said cylinder;

means between said yarn supply and said cylinder for guiding the yarn ends from said yarn supply to the surface of said cylinder at said first end portion of said cylinder in spaced substantially parallel relationship to one another around the circumference of said cylinder;

means for guiding the plurality of yarn ends longitudinally along said surface of said cylinder from said first end portion to said second end portion in their substantially parallel spaced relationship to one another;

means for winding other yarns around said cylinder transversely to and in close overlying relationship with the longitudinally-guided yarns;

means for applying a liquid resin to the longitudinal yarns while the yarns are on said cylinder and while maintaining the parallel spaced relationship of the longitudinal yarns on said cylinder;

a hollow water jacket secured to the interior of said second end portion of said cylinder for preventing adhesion between the outer surface of said cylinder and the partially cured longitudinal and transverse yarns; and means for separating sections of a substrate formed by partially curing the longitudinal and transverse yarns as the substrate advances along the outer surface of said cylinder.

35. An apparatus according to claim 34 further comprising:

means for controlling the delivery rate of yarn from said yarn supplying means to said cylinder;

means for metering the amount of resin delivered to the longitudinal and transverse yarns adjacent said yarn controlling means; and means for detecting the delivery rate of transverse yarns from said yarn winding means to said cylinder adjacent and delivering a signal to said yarn controlling means and said resin metering means positioned adjacent said yarn winding means;

wherein said yarn controlling means, said detecting means, and said resin metering means are in communication;

wherein said yarn controlling means is responsive to said detecting and delivering means such that said yarn controlling means adjusts the rate at which longitudinal yarns are advanced from said first end portion of said cylinder to said second end portion of said cylinder according to a desired yarn count of resulting substrate;

wherein said resin metering means is responsive to said detecting and delivering means such that said resin metering means adjusts the amount of resin applied to the yarn ends and the transverse yarns along the outer surface of said cylinder.

* * * * *